US010291065B2

(12) United States Patent
Chan et al.

(10) Patent No.: US 10,291,065 B2
(45) Date of Patent: May 14, 2019

(54) ROBUST AND HIGH CURRENT SMART-PLUG

(71) Applicant: Computime, Ltd., Wanchai (HK)

(72) Inventors: Dick Kwai Chan, Hong Kong (HK); Kam Wai Lam, Hong Kong (HK); JZ Zheng, Shenzhen (CN); Wai Yin Shum, Hong Kong (HK); Brenton James Judge, Hong Kong (HK); Hamza Yilmaz, Gilroy, CA (US); Patrick Yeung, Hong Kong (HK); Wai Ming Wu, Hong Kong (HK)

(73) Assignee: Computime, Ltd., New Territories (HK)

( * ) Notice: Subject to any disclaimer, the term of this patent is extended or adjusted under 35 U.S.C. 154(b) by 179 days.

(21) Appl. No.: 15/412,841

(22) Filed: Jan. 23, 2017

(65) Prior Publication Data

US 2017/0288456 A1    Oct. 5, 2017

Related U.S. Application Data

(60) Provisional application No. 62/317,899, filed on Apr. 4, 2016.

(51) Int. Cl.
*H01R 13/66*    (2006.01)
*H02J 13/00*    (2006.01)
(Continued)

(52) U.S. Cl.
CPC ........ *H02J 13/0075* (2013.01); *G01R 21/133* (2013.01); *H01R 13/6658* (2013.01);
(Continued)

(58) Field of Classification Search
CPC ......... H01R 13/66; H01H 50/54; H04W 4/00; G08B 13/14
(Continued)

(56) References Cited

U.S. PATENT DOCUMENTS

| 3,936,840 | A | * | 2/1976 | Buckreus | G01D 15/16 346/32 |
| 4,075,617 | A | * | 2/1978 | Wireman | G08B 13/1409 200/51.1 |
| 4,086,643 | A | * | 4/1978 | Jacobs | H01R 13/713 361/115 |
| 4,608,531 | A | * | 8/1986 | Stephens | G05D 1/0055 324/73.1 |

(Continued)

OTHER PUBLICATIONS

TI Designs, Smart Plug with Remote Disconnect and Wi-Fi Connectivity, TIDU531—Sep. 2014, Texas Instruments Incorporated, pp. 1-29.

*Primary Examiner* — Xiaoliang Chen

(74) *Attorney, Agent, or Firm* — Banner & Witcoff, Ltd.

(57) ABSTRACT

A smart plug that is partitioned into a plurality of printed circuit boards (PCBs) in a three dimensional manner to reduce its size. Aspects consider the effect of the possible increased internal temperature as the size of the smart plug is reduced. For example, thick metal foils connect various components of a smart plug to reduce heat dissipation within the smart plug. Also, a metal foil may transfer heat from contact metal on a PCB to a side wall of a plastic housing of the smart plug. The smart plug may comprise a computing device that obtains information identifying the attached electrical device and accesses device data about the time duration during which the attached electrical device exhibits transient characteristics. The computing device then uses the accessed data to effectively control the attached electrical device.

22 Claims, 13 Drawing Sheets

(51) Int. Cl.
*H05K 1/02* (2006.01)
*H05K 1/14* (2006.01)
*G01R 21/133* (2006.01)
*H01R 24/30* (2011.01)
*H01R 24/78* (2011.01)
*H01R 103/00* (2006.01)
*H05K 1/11* (2006.01)
*H05K 3/28* (2006.01)

(52) U.S. Cl.
CPC ............ *H01R 24/30* (2013.01); *H01R 24/78* (2013.01); *H05K 1/0201* (2013.01); *H05K 1/144* (2013.01); *H01R 2103/00* (2013.01); *H05K 1/0263* (2013.01); *H05K 1/11* (2013.01); *H05K 3/284* (2013.01); *H05K 2201/10272* (2013.01); *Y02B 70/3266* (2013.01); *Y02B 90/226* (2013.01); *Y02B 90/2653* (2013.01); *Y04S 20/16* (2013.01); *Y04S 20/242* (2013.01); *Y04S 40/126* (2013.01)

(58) Field of Classification Search
USPC ............ 174/260, 261; 307/18, 29, 115; 340/687; 455/41.1; 361/92, 690, 718, 361/806; 439/339, 620.21
See application file for complete search history.

(56) References Cited

U.S. PATENT DOCUMENTS

| | | | | |
|---|---|---|---|---|
| 5,572,409 | A * | 11/1996 | Nathan | G01R 1/04 174/261 |
| 6,653,802 | B1* | 11/2003 | Nelson | H05B 39/00 315/291 |
| 2006/0194467 | A1* | 8/2006 | Beasley | H01R 13/6641 439/339 |
| 2012/0014059 | A1* | 1/2012 | Zeng | H02M 7/003 361/690 |
| 2012/0014069 | A1* | 1/2012 | Zeng | H01L 23/4334 361/718 |
| 2012/0021618 | A1* | 1/2012 | Schultz | H01R 13/719 439/38 |
| 2012/0166582 | A1* | 6/2012 | Binder | H04L 63/18 709/217 |
| 2015/0076904 | A1* | 3/2015 | Mills | H01H 50/54 307/29 |
| 2015/0115739 | A1* | 4/2015 | Kim | H02M 7/12 307/115 |
| 2016/0044447 | A1* | 2/2016 | Tetreault | G01K 1/024 455/41.1 |
| 2016/0305992 | A1* | 10/2016 | Yeo | H04W 4/80 |
| 2016/0380392 | A1* | 12/2016 | Justice | H01R 13/713 307/18 |
| 2018/0043846 | A1* | 2/2018 | Salter | B60R 16/03 |

* cited by examiner

ROBUST AND HIGH CURRENT SMART-PLUG

This patent application claims priority to U.S. provisional patent application Ser. No. 62/317,899 entitled "Robust and High Current Smart-Plug" filed on Apr. 4, 2016, which is hereby incorporated by reference in its entirety.

TECHNICAL FIELD

Aspects of the disclosure relate to a smart plug that provides electrical power to an attached electrical device such as an appliance.

BACKGROUND OF THE INVENTION

A smart plug is typically a device that plugs right into an ordinary outlet and has its own outlet. An appliance may be plugged into the smart plug's outlet to obtain enhancements with respect to the ordinary electrical outlet. For example, a smart plug may, via an app, enable a user to actively control it, automate it according to a time schedule, or trigger it from another electronic system.

Smart plugs may be a versatile building block of the smart home, with numerous uses for security, convenience, and energy savings. However, these capabilities typically require corresponding circuit complexity while supplying substantial electrical power under high and varying current loads to the attached appliance. Consequently, there is a real market need to provide a smart plug with a desired robustness.

SUMMARY OF THE INVENTION

An aspect supports a smart plug that is partitioned into a plurality of printed circuit boards (PCBs) in accordance with an embodiment. The smart plug may measure and save energy usage for an attached electrical device as well as control the electrical device.

With another aspect, a smart plug is partitioned into three printed circuit boards (PCB), for example, including a main PCB, relay PCB, and power PCB in a three dimensional manner to reduce its size. Aspects of the embodiments consider the effect of the possible increased internal temperature as the size of the smart plug is reduced.

With another aspect, thick metal foils (e.g., copper foils) connect various components of a smart plug to reduce heat dissipation within the smart plug. With some embodiments, the thickness of a copper foil may be in the range between 0.1 mm to 1.0 mm in order to increase the conductivity of a foil with respect to traditional approaches.

With another aspect, a metal foil transfers heat from contact metal on a PCB to a side wall of a plastic housing of the smart plug.

With another aspect, a smart plug comprises a computing device. The computing device obtains information identifying the attached electrical device and accesses device data about the time duration (a predetermined time duration) during which the attached electrical device exhibits transient behavior. In addition, the device data may include information about the current limit of the attached device after the transient behavior has subsided.

With another aspect, a smart plug determines whether a predetermined timer has expired. If so, the smart plug senses the current and determines if the sensed current exceeds the current limit for the attached electrical device. If so, the smart plug limits the current based on the electrical characteristics of the attached electrical device.

With another aspect, a smart plug receives an identification of the attached electrical device and determines electrical characteristics of the attached device from the identification. The smart plug may access a data structure (either internal or external to the smart plug) that maps the device identification to the electrical characteristics. The electrical characteristics may include different attributes of the attached device including a predetermined time duration when the attached device is experiencing transient conditions after starting as well as a current limit after the attached device has stabilized.

BRIEF DESCRIPTION OF THE DRAWINGS

The foregoing summary of the invention, as well as the following detailed description of exemplary embodiments of the invention, is better understood when read in conjunction with the accompanying drawings, which are included by way of example, and not by way of limitation with regard to the claimed invention.

DETAILED DESCRIPTION

Figure 1:
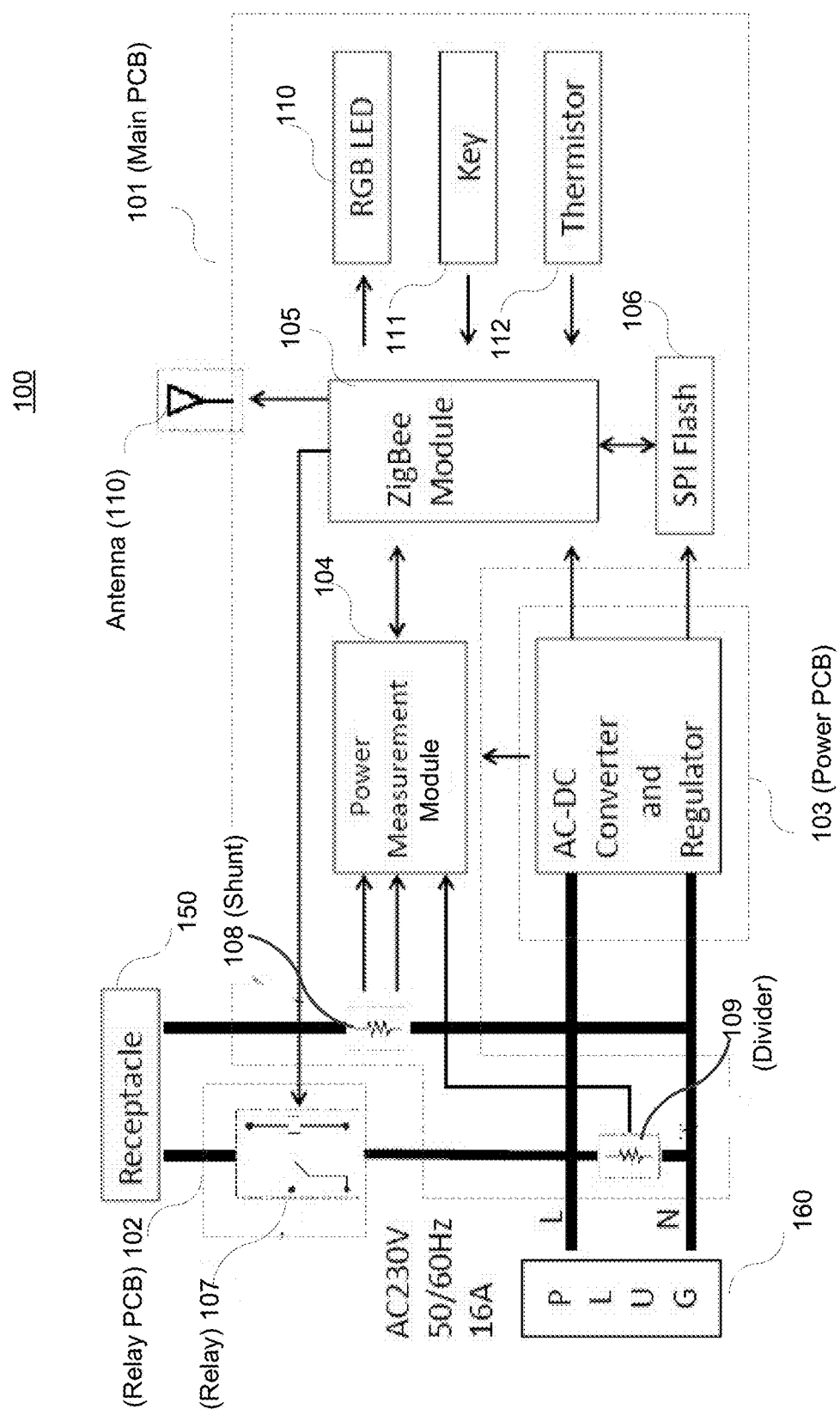
FIG. 1 shows a smart plug partitioned into a plurality of printed circuit boards (PCBs) in accordance with an embodiment.

FIG. 1 shows smart plug 100 partitioned into a plurality of printed circuit boards (PCBs) in accordance with an embodiment. The smart plug may measure and save energy usage for an attached electrical device (e.g., an appliance) with respect to traditional electrical plugs as well as control the attached electrical device.

Figure 12:
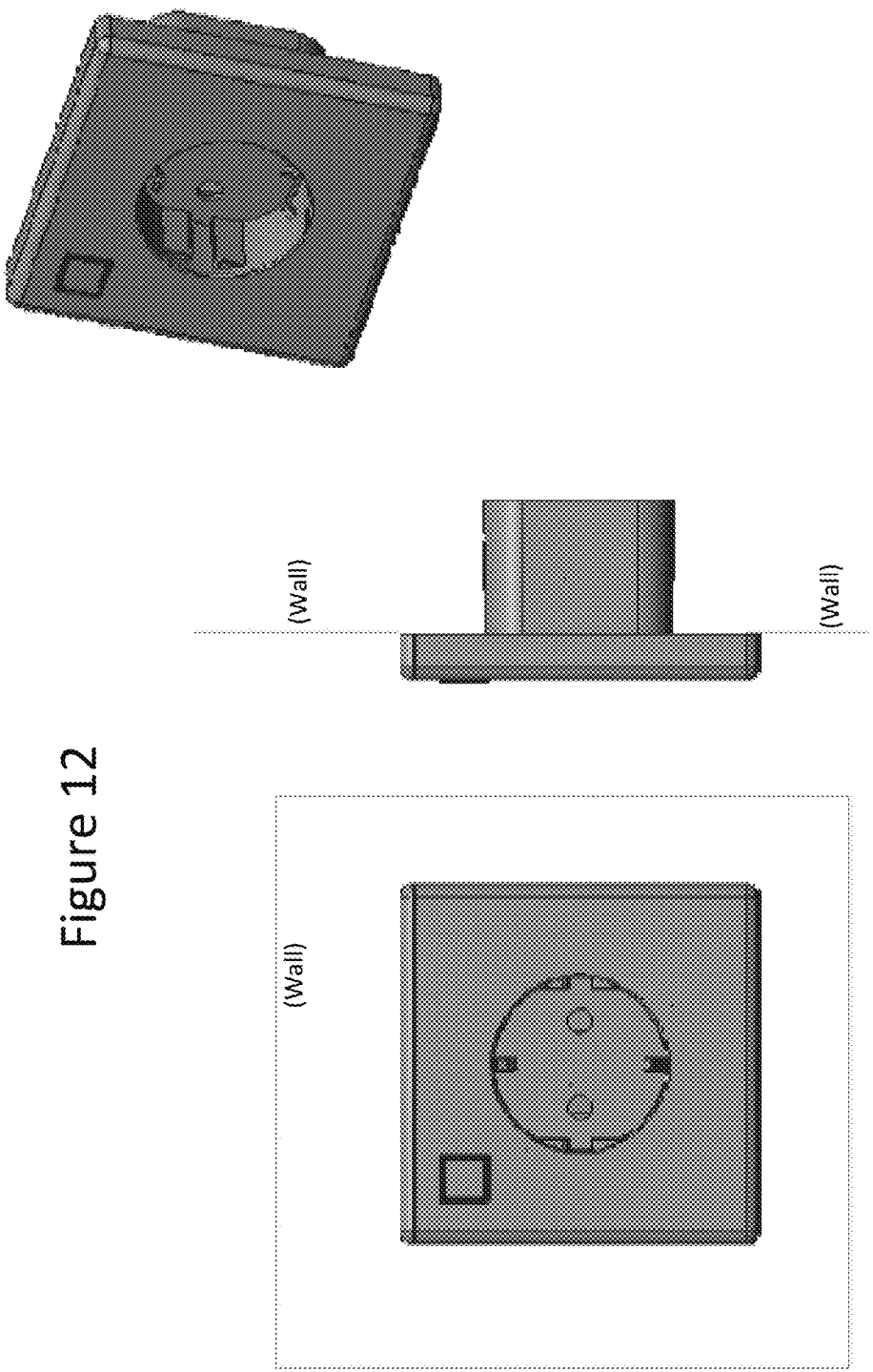
FIG. 12 shows a smart wall-mounted socket (SWS) in accordance with an embodiment.

In according to an aspect of the embodiments, a smart plug may assume different configurations including a plug of an electrical device, an adapter that plugs into an existing electrical receptacle, or a receptacle itself. When assuming a form of an adapter, a smart plug has an electrical outlet that accommodates plug 160 of an external electrical device. Present inventions are applicable to a Smart Wall mounted Socket (SWS) as well as just replacing metal pins of plug with "L" and "N" wire connections, wall mount fixtures, and modified housings as shown in FIG. 12. A smart plug may comprise a socket (electrical outlet) with remote controlled switch and power consumption reporting. Smart plug 100 may support communication with other devices through a variety of communication channels, for example, in accordance with the ZigBee® protocol. The smart plug may be turned ON/OFF remotely through ZigBee HA 1.2 profile. The smart plug may also measure, via measurement module 104, the power/energy consumption of the appliance connected to the socket. Upon receiving a valid command from other device, the smart plug may send the power/energy usage information to other device through a ZigBee simple meter cluster protocol. Internal functions may also improve temperature and ruggedness of the smart plug.

Referring to FIG. 1, when smart plug 100 is appropriately connected to electrical power, smart plug 100 may be configured to measure, monitor, and control electrical power to the attached electrical device. Smart plug 100 may communicate with a wireless device (e.g., a smart phone) via antenna 110 so that the user can receive and/or transmit information to the smart plug via an app over a wireless channel in order to monitor and control the attached electrical device.

As shown in FIG. 1, ZigBee module 105 and power measurement module 104 are powered by an AC-DC convertor (power PCB 103) that connects directly to electrical supply lines (L and N).

SPI flash memory 106 may offer an Over-The-Air (OTA) feature for updating firmware. The power measurement module 104 samples the loading current and voltage through shunt resistor (current-sensing resistor) 108 and voltage divider 109, respectively, every time it receives a request from ZigBee module 105. The voltage drop ($V_{sense}$) across shunt resistor 108 is indicative of the current provided to the electrical load through the N line, where $V_{sense} = R_{shunt} * Current_{load}$.

Voltage divider 109 is configured across L and N lines to proportionally scale the line voltage down in order to sense the line voltage when relay 107 is on. Voltage divider 109 enables power measurement module 104 to sense the line voltage, where module 104 typically supports a lower voltage range.

An end user may, though a simple User Interface (UI) (comprising RGB LED 110 and key 111) instruct relay 107 to switch the AC output on/off at receptacle 150. In emergency situations, thermistor 112 may be used to monitor the maximum allowed operating temperature inside the plastic housing. When the operating temperature exceeds the maximum temperature limit, the AC output at receptacle 150 may be automatically switched off.

Figure 4:
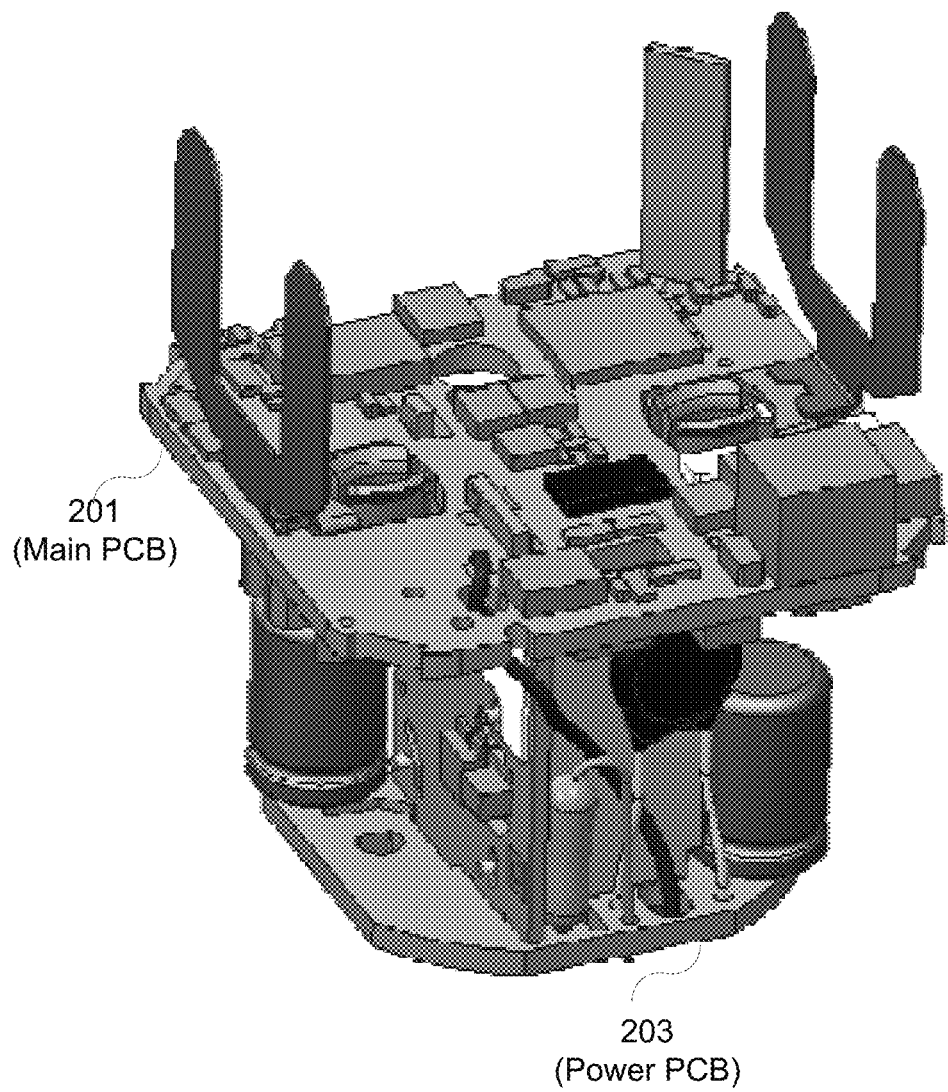
FIG. 4 shows a three dimensional PCB assembly in accordance with an embodiment.

Smart plug 100, as shown in FIG. 1, is partitioned into three printed circuit boards: Main PCB 101, Relay PCB 102, and Power PCB 103 to reduce its size. Assembly of these PCB's may be arranged in a three dimensional configuration as shown in FIG. 4. However, as smart plug 100 is reduced in size, the effect of the possible increased internal temperature must be considered as discussed below.

With some embodiments, a smart plug may be differently partitioned into a plurality of PCBs depending on the structure of the housing and PCB design.

Figure 2:
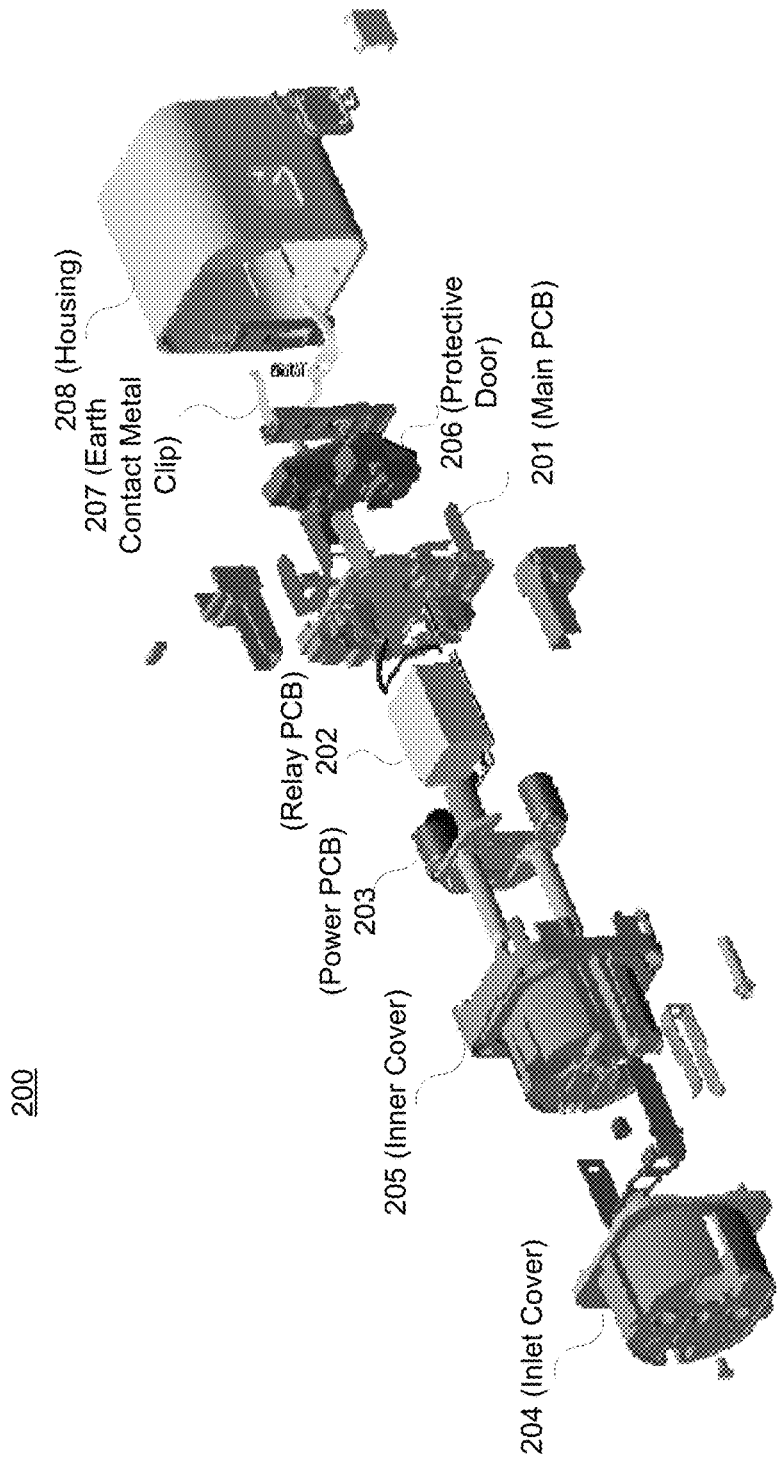
FIG. 2 shows a smart plug in accordance with an embodiment.

FIG. 2 shows smart plug 200 in accordance with an embodiment. In addition to electronics components, smart plug 200 typically has numerous metal and plastic parts.

Smart plug 200 plugs into the outlet (not explicitly shown in FIG. 2) of an existing electrical receptacle. An electrical device (e.g. electrical appliance) then plugs into the outlet of smart plug 200. Smart plug 200 may support one of the plug styles shown in FIG. 11.

With the typical large size characterized in accordance with traditional approaches, there is sufficient area on the PCB to place electronics far away enough from plug's metal contact so that temperature inside the smart plug is lower than safety limits while being robust during unplug and plug maximum load current conditions.

However, as the size of the smart plug shrinks in accordance with traditional approaches, the smart plug may not be able to survive a "plug and unplug" test under a maximum load current mode of operation and may not be able to maintain its internal temperature under required certification limit due to power dissipation during normal operation.

According to aspects of the embodiments, as will be discussed, the above issues may be addressed, thus providing a robust and high current smart plug for a reduced size with respect to traditional approaches.

Referring to FIG. 2, smart plug 200 comprises components that arranged in a stacked configuration to reduce the size. For example, power PCB 203 is located next to relay PCB 202, which in turn is located next to main PCB 201.

Components of smart plug 200 are located within housing 208. The plug of an attached electrical device (not explicitly shown in FIG. 2) is inserted into an electrical outlet of inlet cover 204. Inner cover 205 couples the outlet to PCB 203 in order to provide electrical power to the attached device. Main PCB 201 is coupled to an existing electrical receptacle (which smart plug 200 is inserted into) through protective door 206 and metal clip 207.

Figure 3:
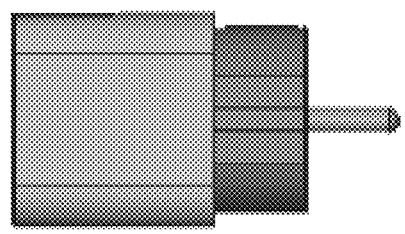
FIG. 3 shows a European style smart plug in accordance with an embodiment.
Figure 3:
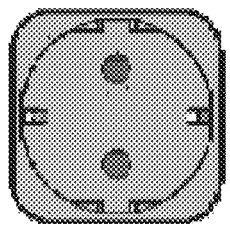
Figure 3:
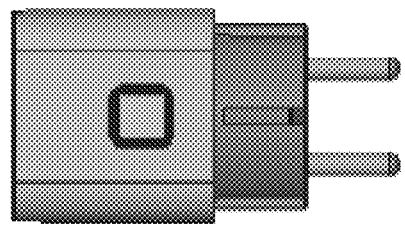
Figure 3:
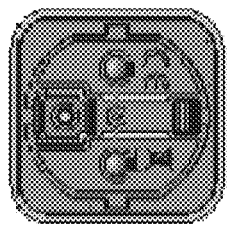
Figure 3:
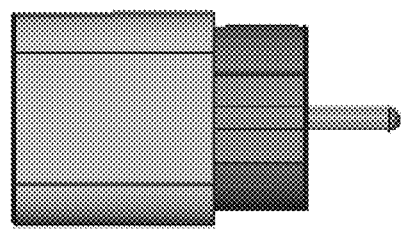
Figure 11:
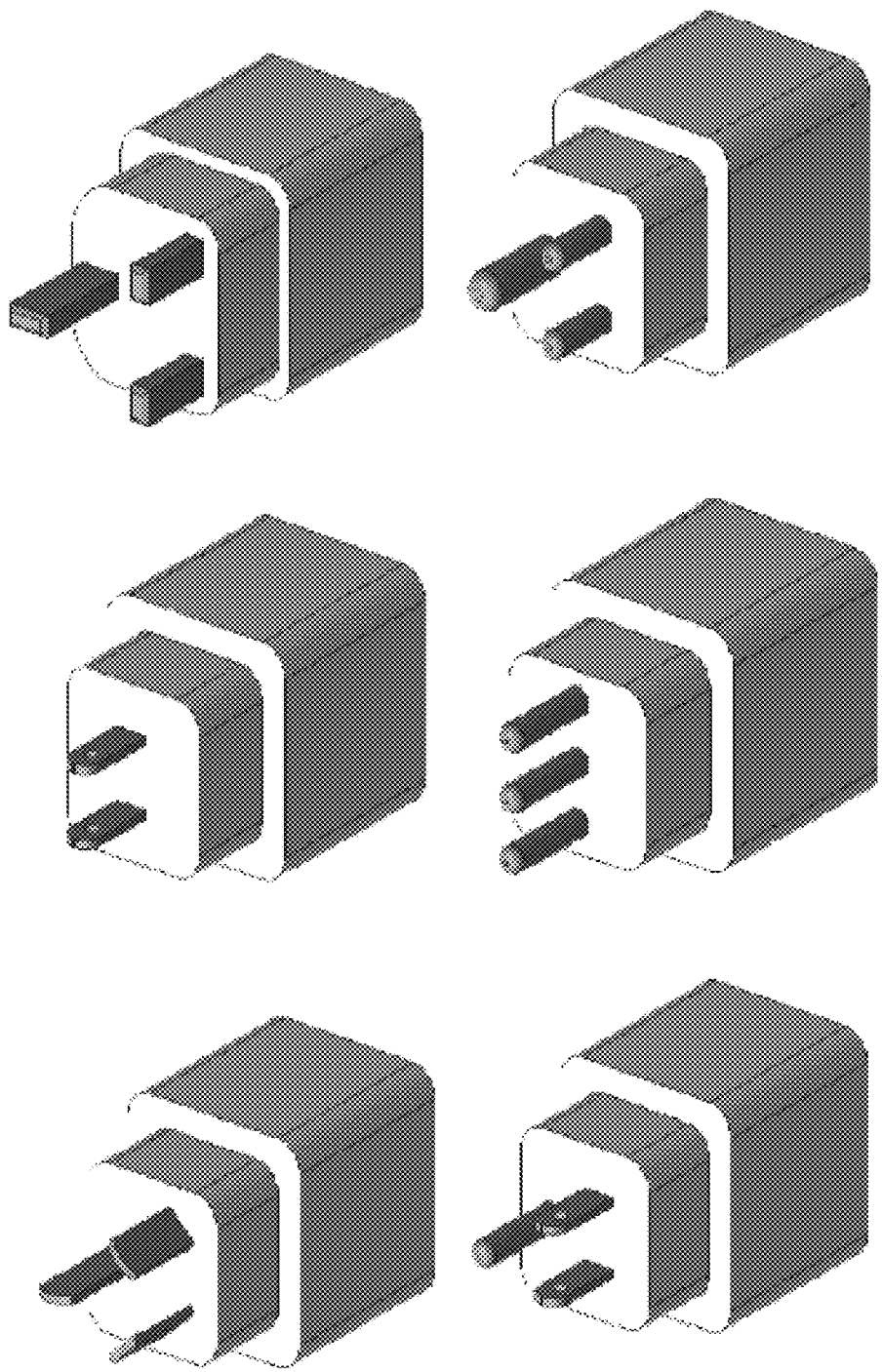
FIG. 11 shows various type of plug styles supported by a smart-plug in accordance with an embodiment.

FIG. 3 shows European style smart-plug 300 in accordance with an embodiment. However, embodiments may support other types of smart plugs for North America, Europe, the United Kingdom, and China as well as other smart plug configurations as shown in FIG. 11.

Figure 5:
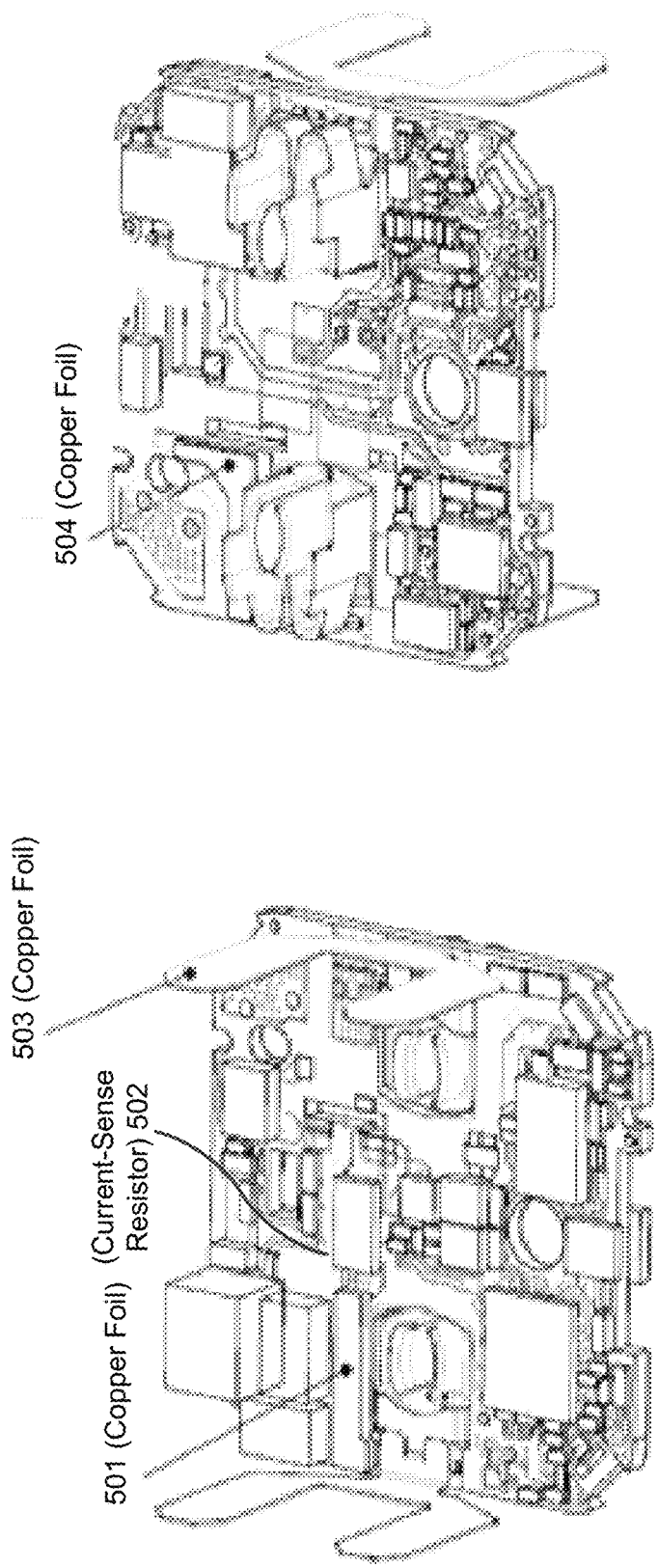
FIG. 5 shows a main PCB in accordance with an embodiment.

FIG. 5 shows a main PCB in accordance with an embodiment. Copper foil 501 connects current-sense resistor 502 (corresponding to shunt resistor 108 as shown in FIG. 1) to the neutral (N) line. Copper foil 503 transfers heat from a contact metal area to a side-wall of the housing (not explicitly shown.) Copper foil 504 connects a relay (corresponding to relay 107 as shown in FIG. 1) to the live (L) line.

Figure 6:
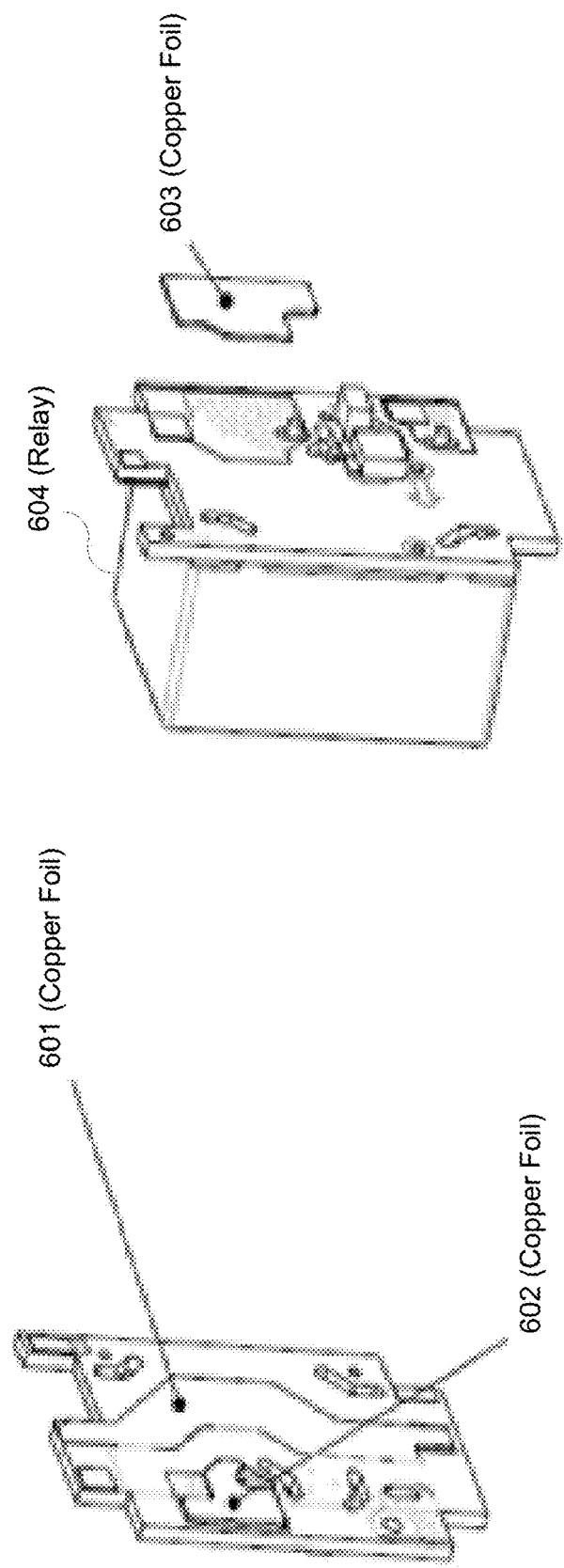
FIG. 6 shows a relay PCB in accordance with an embodiment.
Figure 7:
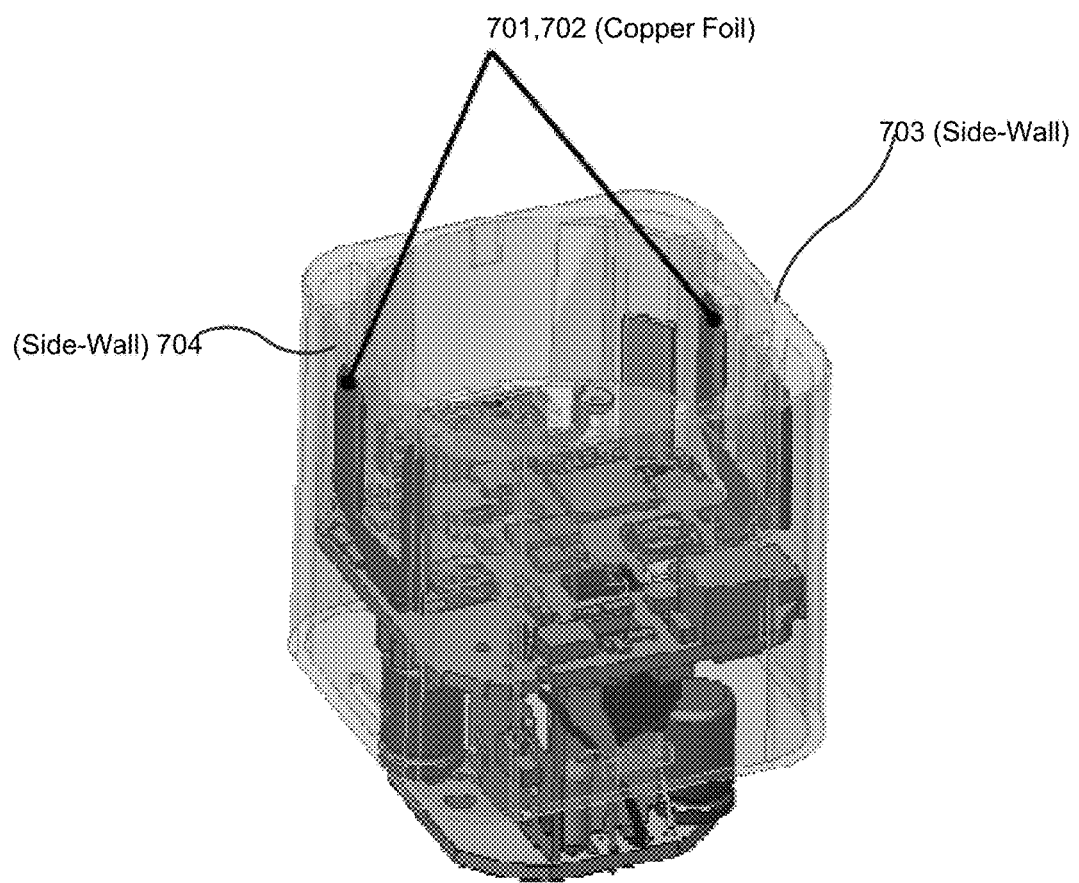
FIG. 7 shows copper foils that transfer heat from a contact metal area to side-walls of the plastic housing of a smart-plug in accordance with an embodiment.

While embodiments may use copper for the foils (e.g. foils 501, 503, and 504 as shown in FIG. 5, foils 601, 602, and 603 as shown in FIG. 6, and foils 701 and 702 as shown in FIG. 7), some embodiments may use a different metal such as silver, gold, aluminum, a metal alloy or any material with high electrical conductivity or low resistivity.

In order to increase the conductivity of a foil, the thickness of the foil may be increased. For example, with some embodiments, the thickness of a copper foil may be in the range between 0.1 mm to 1.0 mm.

FIG. 6 shows a relay PCB in accordance with an embodiment. Copper foil 601 connects a current-sense resistor to the neutral (N) line. The current-sense resistor (shunt resistor) is shown as resistor 502 as shown in FIG. 5.

Copper foils 602 and 603 connect relay 604 to the live (L) line.

FIG. 7 shows copper foils 701 and 702 that transfer heat from a contact metal area to side-walls 703,704 of the plastic housing of a smart-plug in accordance with an embodiment.

Figure 8:
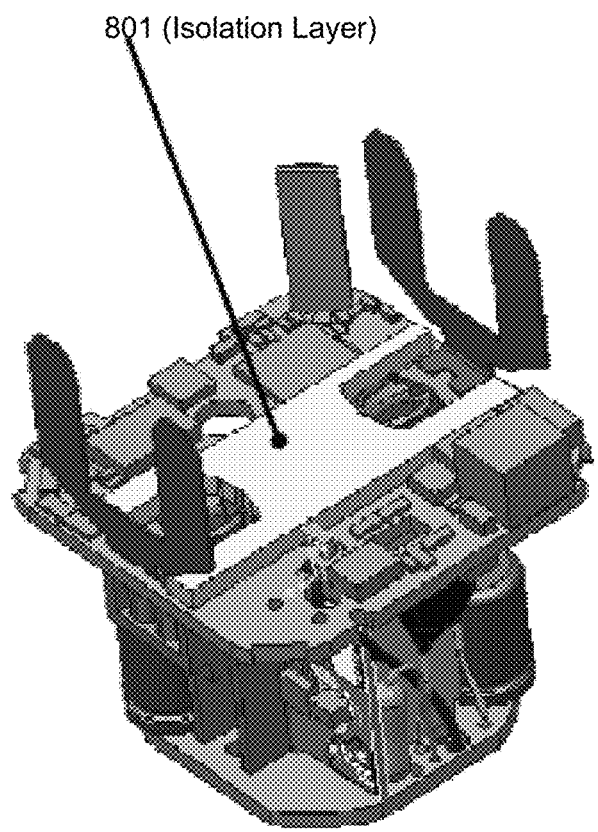
FIG. 8 shows a main PCB with an electrical isolation layer in accordance with an embodiment.

FIG. 8 shows a main PCB with electrical isolation layer 801 in accordance with an embodiment. Layer 801 may be formed by applying a liquid such as RTV (Room Temperature Vulcanization silicone), glue, or epoxy after curing the liquid at about room temperature to less than 100 degrees Centigrade. Room temperature typically refers to a temperature range from 20 degrees Centigrade to 26 degrees Centigrade.

Figure 9B:
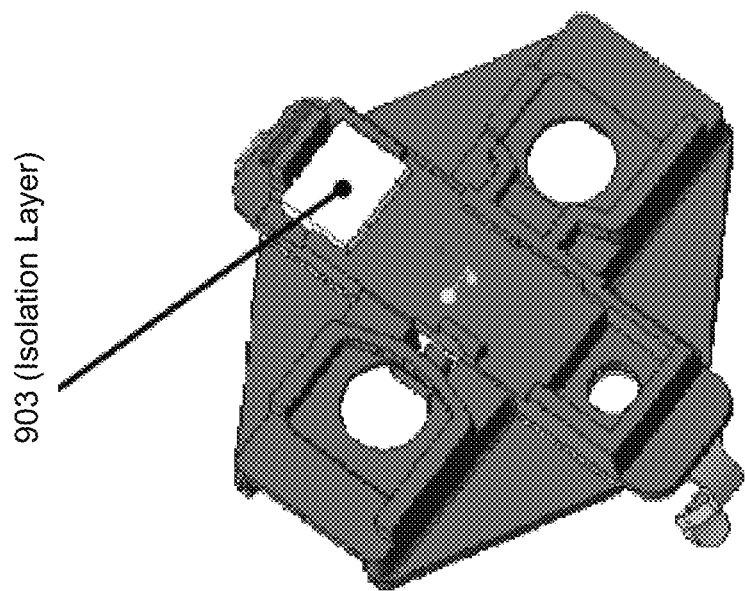
FIG. 9B shows the metal rivet shown in FIG. 9A covered by an electrical isolation layer in accordance with an embodiment.
Figure 9A:
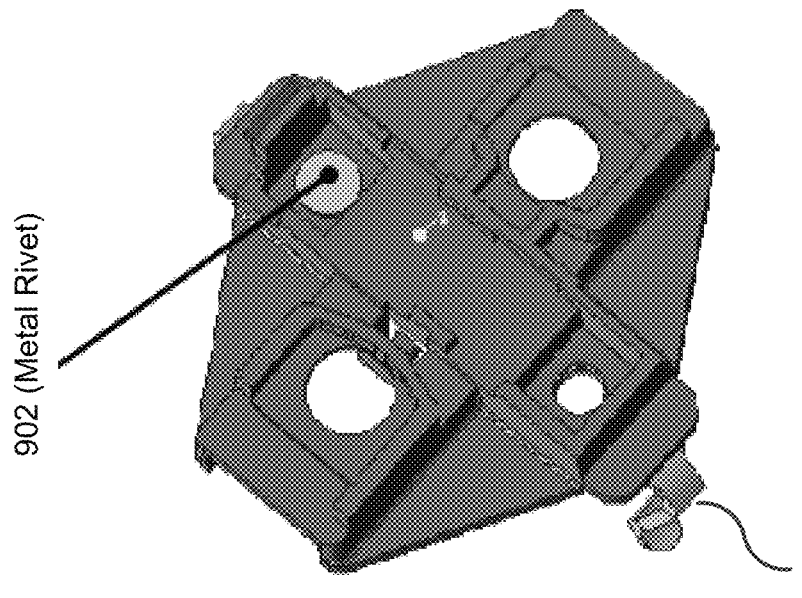
FIG. 9A shows an earth ground clip held to a top cover with a metal rivet in accordance with an embodiment.

FIG. 9A shows earth ground clip 901 held to a top cover (not explicitly shown) with metal rivet 902 in accordance with an embodiment.

FIG. 9B shows metal rivet 901 shown in FIG. 9A with an electrical isolation layer 903 in accordance with an embodiment. Isolation layer 903 provides sufficient electrical isolation to prevent electric arcing to rivet 901.

Figure 10:
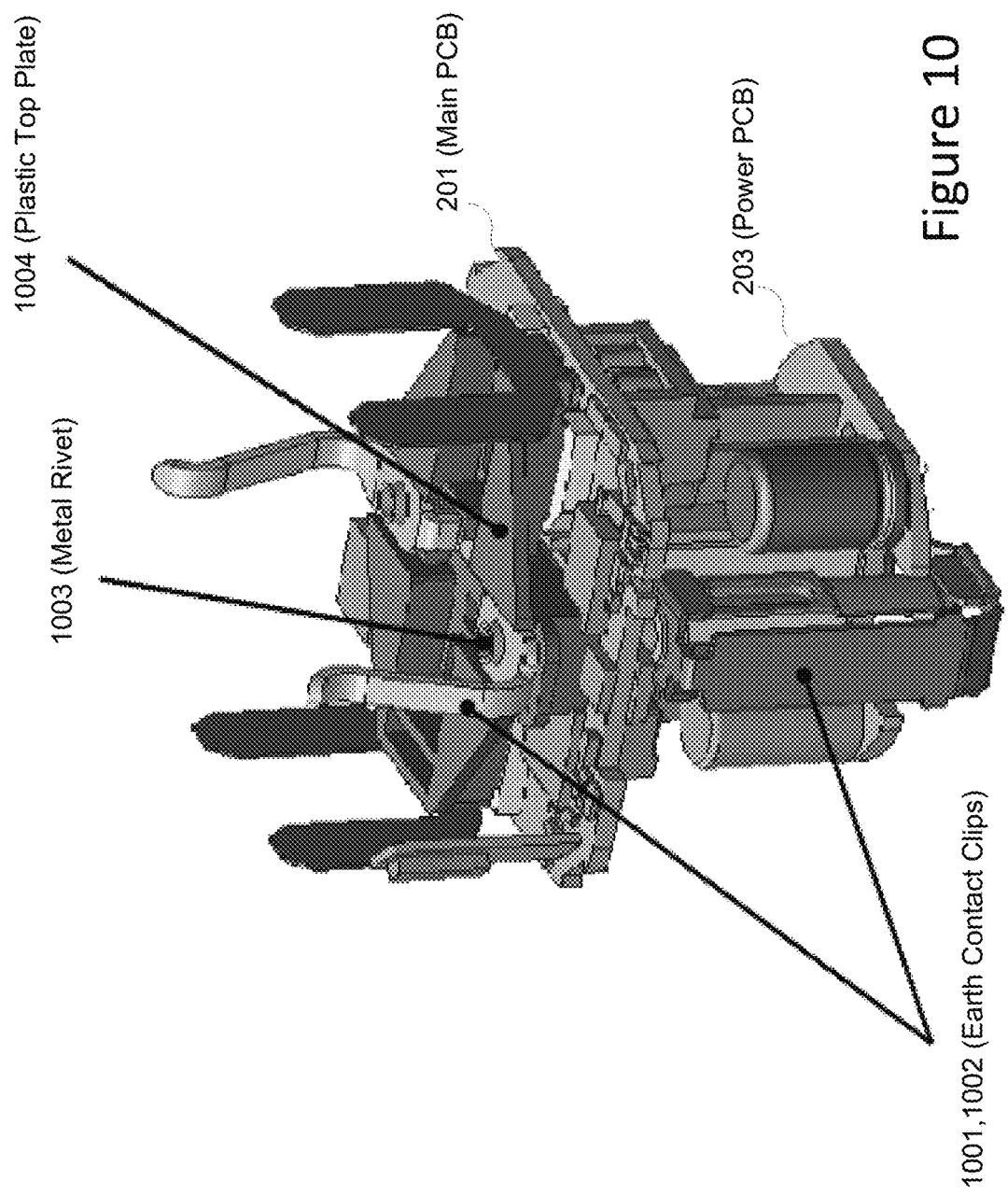
FIG. 10 shows an earth contact metal connection in accordance with an embodiment.

FIG. 10 shows an earth contact metal clips 1001 and 1002 in accordance with an embodiment. Metal clips 1001 and 1002 provide an electrical connection to earth ground. Metal clip 1001 is held in place by metal rivet 1003 to top plate 1004.

FIG. 11 shows various types of plug styles supported by a smart plug in accordance with an embodiment.

FIG. 12 shows a smart wall-mounted socket (SWS) in accordance with an embodiment. The SWS replaces an existing electrical receptacle and provides an electrical outlet for an appliance plug. The SWS may be permanently mounted into a wall with all of the attributes of a smart plug with the prongs replaced with L and N wire connectors. However, some embodiments support an adaptor (which may also be referred to as "smart plug") that plugs into an existing receptacle.

Figure 13:
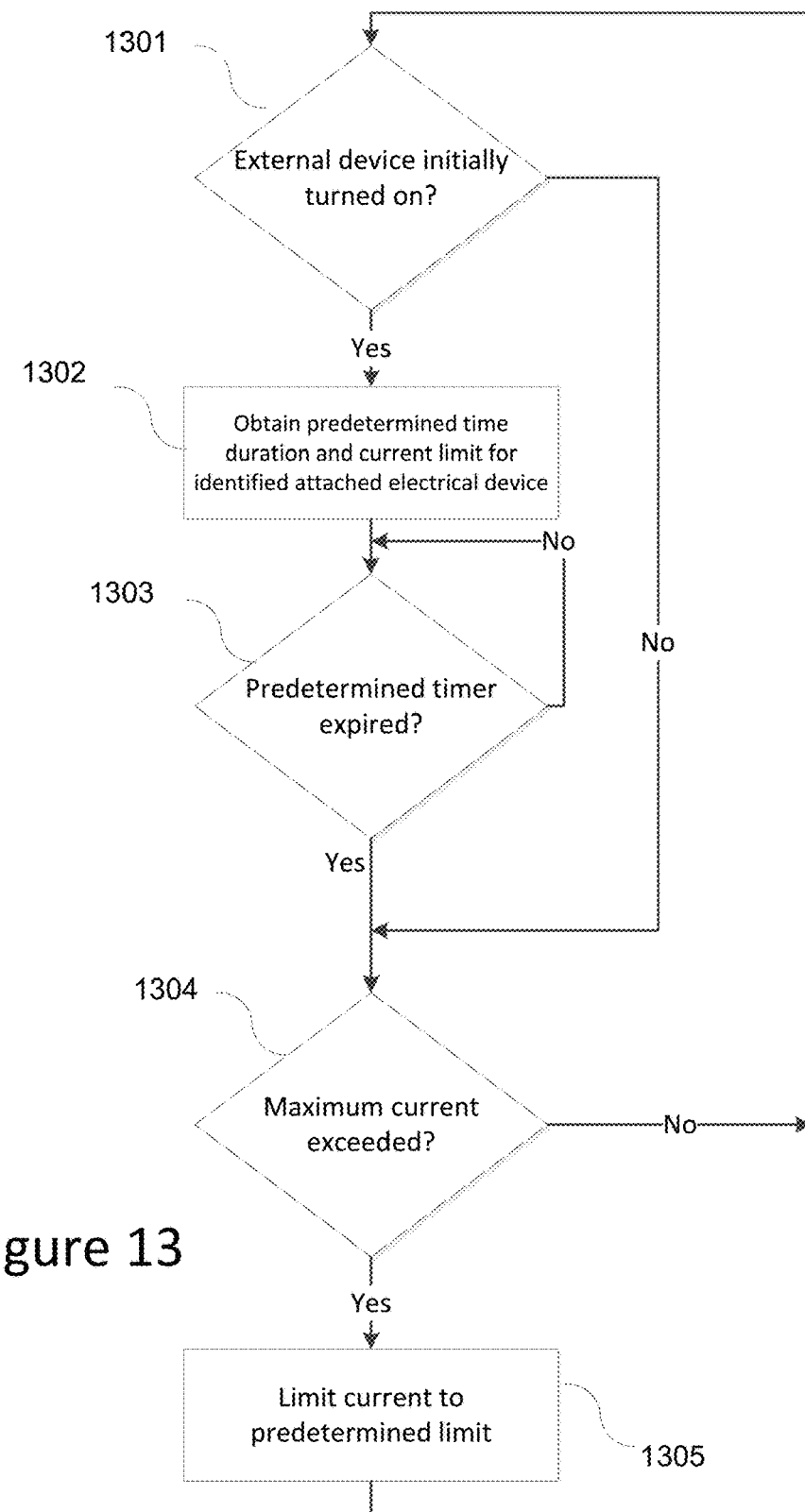
FIG. 13 shows a flowchart in which a smart plug processes measurements about electrical power consumption by an attached electrical device in accordance with an embodiment.

FIG. 13 shows process 1300 in which a smart plug processes measurements about electrical power consumption by an attached electrical device in accordance with an embodiment. Process 1300 may be performed by a computing device executing computer-executable instructions.

At block 1301, process 1300 determines whether the attached electrical device (e.g., appliance) is initially turned on. Typically, an electrical device (for example an electric motor) has transient characteristics and may draw greater current for a short period of time after it is started.

Different types of electrical devices may have different electrical characteristics. For example, an external electrical device identification (e.g., manufacturer name, type of appliance, and model number) may be presented via an app executing on a smart phone in communication with the smart plug. The computing device may then access a data structure that maps the identified device to electrical characteristics. Alternatively, the app may access a data structure and provide the electrical characteristics of the attached device to the smart plug.

At block 1302, the computing device obtains information identifying the attached electrical device and accesses device data about the time duration (a predetermined time duration) during which the attached electrical device exhibits transient behavior. In addition, the device data includes information about the current limit of the attached device after the transient behavior has subsided.

At block 1303, the processing device determines whether the predetermined timer has expired. If so, the smart plug senses the current at block 1304 and determines if the sensed current exceeds the current limit for the attached electrical device. If so, the smart plug limits the current provided to the attached electrical device at block 1305.

With reference to FIG. 1, smart plug 100 may include a computing device (not explicitly shown) wherein processes (e.g., shown in FIG. 13) discussed herein may be implemented. The computing device may have a processor for controlling overall operation of the computing device and its associated components, including RAM, ROM, communications module, and memory device. For example, the computing device may be located in module 105 and may execute computer-executable instructions accessed from flash memory 106.

The computing device typically includes a variety of computer readable media. Computer readable media may be any available media that may be accessed by computing device and include both volatile and nonvolatile media, removable and non-removable media. By way of example, and not limitation, computer readable media may comprise a combination of computer storage media and communication media.

Computer storage media may include volatile and non-volatile, removable and non-removable media implemented in any method or technology for storage of information such as computer readable instructions, data structures, program modules or other data. Computer storage media include, but is not limited to, random access memory (RAM), read only memory (ROM), electronically erasable programmable read only memory (EEPROM), flash memory or other memory technology, CD-ROM, digital versatile disks (DVD) or other optical disk storage, magnetic cassettes, magnetic tape, magnetic disk storage or other magnetic storage devices, or any other medium that can be used to store the desired information and that can be accessed by the computing device.

Communication media typically embodies computer readable instructions, data structures, program modules or other data in a modulated data signal such as a carrier wave or other transport mechanism and includes any information delivery media. Modulated data signal is a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media.

The following embodiments describe innovative aspects that are directed to a smart plug. For example, one aspect reduces internal power dissipation and consequently avoids an internal temperature rise with respect to traditional approaches. Another aspect enhances the degree of safety when plugging or unplugging an attached electrical device (e.g., an appliance).

With a first embodiment, to minimize size, a smart plug structure is partitioned into multiple PCBs such as main, power, and relay type PCBs with copper foils. Assembly of these PCBs may be constructed in a three-dimensional fashion as shown in FIG. 4.

With a second embodiment, to minimize power dissipation (and thus the temperature rise within a smart plug) the smart plug may comprise a low contact resistance relay and thick copper foils that are electrically connected on top of PCB traces in both neutral (N) and live (L) lines to reduce resistance of the load current path.

With a third embodiment, copper foil may be used to connect a current-sense resistor in neutral plug or socket contact metal in one side and metal pin on the other side as shown in FIG. 5.

With a fourth embodiment, copper foil may be used to connect a relay in live plug or socket contact-metal in one side and metal pin on the other side as shown in FIG. 6.

With a fifth embodiment, a connection between main and relay PCBs is supported with thick copper foils and a thick solder joint.

With a sixth embodiment, a connection between power and relay PCBs is supported with thick copper foils and a thick solder joint.

With a seventh embodiment, the thickness of copper foil ranges from 0.1 to 1 mm.

With an eighth embodiment, thick copper foils may be pure copper or copper alloy.

With a ninth embodiment, to further reduce a temperature rise at metal contacts both in neutral and live lines, copper foil with large surface area transfers heat from contact metal area to side-walls of the plastic housing as shown in FIG. 7.

With a tenth embodiment, to ruggedize smart plug under "plug and unplug" test with maximum load current, components on a main PCB are electrically insulated from the contact-metals by covering these components with an electrical isolation layer as shown in FIGS. 8 and 9B.

With an eleventh embodiment, an electrical isolation layer is applied in a liquid form such as RTV, glue, or epoxy after curing it at about room temperature to less than 100 degrees Centigrade.

With a twelfth embodiment, the electrical isolation layer comprises a tape form having a thickness within a 0.1 to 1 millimeters range.

With a thirteenth embodiment, the electrical isolation layer is a solid layer assembled on a main PCB.

With a fourteenth embodiment, to further ruggedize smart plug under "plug and unplug" mode of operation, an earth contact metal connection to plastic top plate via metal rivet is also electrically isolated on the backside/opposite side of the plastic top plate to prevent arcing from live or neutral contacts to the earth contact as shown in FIG. 10.

With a fifteenth embodiment, metal rivet electrical isolation is obtained by applying a liquid form such as RTV, glue, or epoxy after curing it at about room temperature to less than 100 degrees Centigrade.

With a sixteenth embodiment, to protect a smart plug and the connected appliance, the smart plug senses the current and limits over-current after a predetermined time duration (e.g. several seconds) to avoid interfering with the initial high current required by some loads such as during motor start up.

With a seventeenth embodiment, over-current limit action is programmable by means of firmware.

With an eighteenth embodiment, thermal grease may be added between copper foils (functioning as heat sinks) and the plastic housing to help increase heat transfer from contact to ambient via copper foil and plastic housing.

With a nineteenth embodiment, the copper heat sinks have a rectangular shape with a post connecting to contact metals.

With a twentieth embodiment, the copper heat sinks have a goal post shape as shown in FIG. 3.

With a twenty first embodiment, basic concepts of the present inventions are used for construction of European, UK, USA, China and other type smart plug styles as shown in FIG. 11.

With a twenty second embodiment, basic concepts of the present inventions are applicable to European, UK, USA, China and other type Smart Wall mounted Socket (SWS) styles as shown in FIG. 12.

With a twenty third embodiment, a computing device of a smart plug receives an device identification of the attached electrical device and determines electrical characteristics of the attached device from the device identification. For example, the computing device may access a data structure (either internal or external to the smart plug) that maps the device identification to the electrical characteristics. The electrical characteristics may include different attributes of the attached device including a predetermined time duration when the attached device is experiencing transient conditions after starting as well as a current limit after the attached device has stabilized.

As can be appreciated by one skilled in the art, a computer system with an associated computer-readable medium containing instructions for controlling the computer system can be utilized to implement the exemplary embodiments that are disclosed herein. The computer system may include at least one computer such as a microprocessor, digital signal processor, and associated peripheral electronic circuitry.

What is claimed is:

1. A smart plug providing an alternating current (AC) electrical signal to an external electrical device through an electrical path comprising a live (L) lead and a neutral (N) lead, the smart-plug comprising:
   a housing;
   an electrical outlet accommodating an electrical plug of the external electrical device;
   a main printed circuit board (PCB) comprising:
      a communication module; and
      an electrical power measurement module measuring a measured power usage of the external electrical device through the electrical outlet;
      the communication module sending data about the measured power usage over a communication channel;
   a relay PCB comprising a relay to control an electrical load provided by the external electrical device;
   a power PCB providing electrical power to the main PCB and regulating the AC electrical signal to the external electrical device; and
   the main PCB, the relay PCB, and the power PCB being arranged in three dimensional manner within the housing of the smart plug; and
   a fifth metal foil that transfers heat from a contact metal area of a PCB to a side-wall of the housing, wherein the housing comprises plastic.

2. The smart plug of claim 1 comprising a first thick lead metal foil in the electrical path to reduce electrical resistance of the electrical path.

3. The smart plug of claim 2, comprising a current-sense resistor, wherein the current-sense resistor is connected to the neutral (N) lead via a second metal foil.

4. The smart plug of claim 2, wherein the relay is connected to the live (L) lead through a third metal foil.

5. The smart plug of claim 2, wherein the main PCB and the relay PCB are connected through a fourth thick metal foil and a first thick solder joint.

6. The smart plug of claim 2, wherein the power PCB and the relay PCB are connected through a fifth thick metal foil and a second thick solder joint.

7. The smart plug of claim 2, wherein the first metal foil has a thickness between 0.1 and 1 millimeter (mm).

8. The smart plug of claim 3, wherein the second thick foil comprises material having copper.

9. The smart plug of claim 1, wherein at least one component on the main PCB is electrically isolated by covering the at least one component with a first electrical isolation layer.

10. The smart plug of claim 9, wherein the first electrical isolation layer is applied in liquid form and is cured at about room temperature to less than 100 degrees Centigrade.

11. The smart plug of claim 9, wherein the first electrical isolation layer comprises a tape form having a thickness between 0.1 to 1 millimeter (mm).

12. The smart plug of claim 9, wherein the first electrical isolation comprises a solid layer.

13. The smart plug of claim 1 comprising an earth ground clip and a plastic top plate, wherein the earth ground clip is connected to the plastic top plate with a metal rivet and wherein the metal rivet is covered with a second electrical isolation layer on the backside of the plastic top plate to prevent electrical arcing from one of the neutral (N) and the live (L) leads to the earth ground clip.

14. The smart plug of claim 13, wherein the second electrical isolation layer is applied in liquid form and is cured at about room temperature to less than 100 degrees Centigrade.

15. The smart plug of claim 1, wherein the smart plug, after a predetermined time, senses electrical current drawn by the external electrical device and limits the electrical current when a current limit is reached.

16. The smart plug of claim 15, wherein the smart plug comprises a computing device and a memory device, the computing device accessing computer-executable instructions from the memory device that cause the computing device to limit the electrical current.

17. The smart plug of claim 1, wherein thermal grease is applied between the fifth metal foil and the plastic housing.

18. The smart plug of claim 1, wherein the fifth metal foil is characterized by a rectangular shape and having a metal post connecting to a contact metal.

19. The smart plug of claim 1, wherein the fifth metal foil is characterized by a goal post shape.

20. The smart plug of claim 1, wherein the smart plug supports a plug style specified in one of the United Kingdom, European Union, China, and the United States.

21. The smart plug of claim 1, wherein the smart plug supports a socket style specified in one of the United Kingdom, European Union, China, and the United States.

22. The smart plug of claim 16, wherein the computing device receives a device identification of the external electrical device and determines at least one electrical characteristic of the external electrical device from the device identification.

* * * * *